(12) United States Patent  (10) Patent No.: US 7,785,921 B1
Juliano et al.  (45) Date of Patent: Aug. 31, 2010

(54) BARRIER FOR DOPED MOLYBDENUM TARGETS

(75) Inventors: Daniel R. Juliano, Santa Clara, CA (US); Deborah Mathias, Mountain View, CA (US); Neil M. Mackie, Fremont, CA (US)

(73) Assignee: Miasole, Santa Clara, CA (US)

( * ) Notice: Subject to any disclaimer, the term of this patent is extended or adjusted under 35 U.S.C. 154(b) by 0 days.

(21) Appl. No.: 12/385,571

(22) Filed: Apr. 13, 2009

(51) Int. Cl.
*H01L 21/00* (2006.01)
(52) U.S. Cl. .......................... 438/95; 438/84; 257/184; 136/264
(58) Field of Classification Search ............ 438/84, 438/95, 102; 257/184, E21.09, E31.015; 136/264, 265, 268
See application file for complete search history.

(56) References Cited

U.S. PATENT DOCUMENTS

| | | | |
|---|---|---|---|
| 4,356,073 A | 10/1982 | McKelvey | |
| 5,435,965 A | 7/1995 | Mashima et al. | |
| 5,522,535 A | 6/1996 | Ivanov et al. | |
| 5,626,688 A * | 5/1997 | Probst et al. | 136/265 |
| 5,814,195 A | 9/1998 | Lehan et al. | |
| 5,904,966 A | 5/1999 | Lippens | |
| 6,020,556 A | 2/2000 | Inaba et al. | |
| 6,310,281 B1 | 10/2001 | Wendt et al. | |
| 6,372,538 B1 | 4/2002 | Wendt et al. | |
| 6,500,733 B1 | 12/2002 | Stanbery | |
| 6,525,264 B2 | 2/2003 | Ouchida et al. | |
| 6,559,372 B2 | 5/2003 | Stanbery | |
| 6,593,213 B2 | 7/2003 | Stanbery | |
| 6,690,041 B2 | 2/2004 | Armstrong et al. | |
| 6,736,986 B2 | 5/2004 | Stanbery | |
| 6,750,394 B2 | 6/2004 | Yamamoto et al. | |
| 6,787,692 B2 | 9/2004 | Wada et al. | |
| 6,797,874 B2 | 9/2004 | Stanbery | |
| 6,822,158 B2 | 11/2004 | Ouchida et al. | |
| 6,852,920 B2 | 2/2005 | Sager et al. | |
| 6,878,612 B2 | 4/2005 | Nagao et al. | |
| 6,881,647 B2 | 4/2005 | Stanbery | |
| 6,936,761 B2 | 8/2005 | Pichler | |
| 6,987,071 B1 | 1/2006 | Bollman et al. | |
| 7,045,205 B1 | 5/2006 | Sager | |
| 7,115,304 B2 | 10/2006 | Roscheisen et al. | |
| 7,122,392 B2 | 10/2006 | Morse | |
| 7,122,398 B1 | 10/2006 | Pichler | |
| 7,141,449 B2 | 11/2006 | Shiozaki | |
| 7,148,123 B2 | 12/2006 | Stanbery | |
| 7,163,608 B2 | 1/2007 | Stanbery | |
| 7,194,197 B1 | 3/2007 | Wendt et al. | |
| 7,196,262 B2 | 3/2007 | Gronet | |

(Continued)

OTHER PUBLICATIONS

U.S. Appl. No. 12/314,519, filed Dec. 11, 2008, Hollars et al.

(Continued)

*Primary Examiner*—Phuc T Dang
(74) *Attorney, Agent, or Firm*—The Marbury Law Group PLLC

(57) ABSTRACT

A sputtering target, including a sputtering layer and a support structure. The sputtering layer includes an alkali-containing transition metal. The support structure includes a second material that does not negatively impact the performance of a copper indium selenide (CIS) based semiconductor absorber layer of a solar cell. The sputtering layer directly contacts the second material.

16 Claims, 12 Drawing Sheets

U.S. PATENT DOCUMENTS

| | | | |
|---|---|---|---|
| 7,227,066 | B1 | 6/2007 | Roscheisen et al. |
| 7,235,736 | B1 | 6/2007 | Buller et al. |
| 7,247,346 | B1 | 7/2007 | Sager et al. |
| 7,253,017 | B1 | 8/2007 | Roscheisen et al. |
| 7,259,322 | B2 | 8/2007 | Gronet |
| 7,262,392 | B1 | 8/2007 | Miller |
| 7,267,724 | B2 | 9/2007 | Tanaka et al. |
| 7,271,333 | B2 | 9/2007 | Fabick et al. |
| 7,291,782 | B2 | 11/2007 | Sager et al. |
| 7,306,823 | B2 | 12/2007 | Sager et al. |
| 7,319,190 | B2 | 1/2008 | Tuttle |
| 7,374,963 | B2 | 5/2008 | Basol |
| 2005/0109392 | A1 | 5/2005 | Hollars |
| 2007/0074969 | A1 | 4/2007 | Simpson et al. |
| 2007/0283996 | A1 | 12/2007 | Hachtmann et al. |
| 2007/0283997 | A1 | 12/2007 | Hachtmann et al. |
| 2008/0000518 | A1 | 1/2008 | Basol |
| 2008/0053519 | A1 | 3/2008 | Pearce et al. |
| 2008/0142071 | A1 | 6/2008 | Dorn et al. |
| 2008/0271781 | A1* | 11/2008 | Kushiya et al. ............. 136/256 |
| 2008/0314432 | A1 | 12/2008 | Paulson et al. |
| 2009/0014049 | A1 | 1/2009 | Gur et al. |
| 2009/0014057 | A1 | 1/2009 | Croft et al. |
| 2009/0014058 | A1 | 1/2009 | Croft et al. |
| 2009/0223556 | A1* | 9/2009 | Niesen et al. ............... 136/255 |

OTHER PUBLICATIONS

U.S. Appl. No. 12/379,427, filed Feb. 20, 2009, Schmidt, Chris.

U.S. Appl. No. 12/379,428, filed Feb. 20, 2009, Schmidt, Chris.

U.S. Appl. No. 12/385,572, filed Apr. 13, 2009, Mackie et al.

U.S. Appl. No. 12/385,570, filed Apr. 13, 2009, Juliano et al.

Bodegård et al., "The influence of sodium on the grain structure of CuInSo$_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.

Contreras et al., "On the role of Na and modifications to Cu(In,Ga)Se$_2$ absorber materials using thin-MF (M=Na, K, Cs) precursor layers," 26$^{th}$ IEEE PVSC, Anaheim, California, Sep. 30-Oct. 3, 1997, 359-362.

Devaney et al., "Recent improvement in CuInSe$_2$/ZnCdS thin film solar cell efficiency," 18th IEEE Photovoltaic Spec. Conf., 1985, New York, 1733-1734.

Evbuomwan et al., "Concurrent materials and manufacturing process selection in design function deployment," Concurrent Engineering: Research and Applications, Jun. 1995, 3(2):135-144.

Granath et al., "Mechanical issues of NO back contracts for Cu(In,Ga)Se$_2$ devices," 13th European Photovoltaic Solar Energy Conference, Proceedings of the International Conference, Nice, France, Oct. 23-27, 1995, Freiesleben et al. Ed., vol. II, 1983-1986.

Hedström et al., "ZnO/CdS/Cu(In,Ga)Se$_2$ thin film solar cells with improved performance," 23$^{rd}$ IEEE Photovoltaic Specialists Conference, Louisville, Kentucky, May 10-14, 1993, 364-371.

Holz et al., "The effect of substrate impurities on the electronic conductivity in CIS thin films," 12$^{th}$ European Photovoltaic Solar Energy Conference, Proceedings of the International Conference, Amsterdam, The Netherlands, Apr. 11-15, 1994, Hill et al. Ed., vol. II, 1592-1595.

Mickelsen et al., "High photocurrent polycrystalline thin-film CdS/CuInSe$_2$ solar cell," Appl. Phys. Lett., Mar. 1, 1980, 36(5):371-373.

Mohamed et al., "Correlation between structure, stress and optical properties in direct current sputtered molybdenum oxide films," Thin Solid Films, 2003, 429:135-143.

Probst et al., "The impact of controlled sodium incorporated on rapid thermal processed Cu(InGa)Se$_2$-thin films and devices," First WCPEC, Hawaii, Dec. 5-9, 2004, 144-147.

Ramanath et al., "Properties of 19.2% Efficiency ZnO/CdS/CuInGaSe$_2$ Thin-film Solar Cells," Progress in Photovoltaics: Research and Applications, 2003, 11:225-230.

Rau et al., "Cu(In,Ga)Se$_2$ solar cells," Clean Electricity From Photovoltaics, Series on Photoconversion of Solar Energy, vol. 1, 2001, Archer et al. Ed., Chapter 7, 277-345.

Rudmann et al., "Effects of NaF coevaporation on structural properties of Cu(In,Ga)Se$_2$ thin films," Thin Solid Films, 2003, 431-432:37-40.

Sakurai et al,. "Properties of Cu(In,Ga)Se2:Fe Thin Films for Solar Cells," Mater. Res. Soc. Symp. Proc., 2005, 865:F14.12.1-F.14.12.5.

Scofield et al., "Sodium diffusion, selenization, and microstructurel effects associated with various molybdenum back contact layers for Cis-based solar cells," Proc. of the 24$^{th}$ IEEE Photovoltaic Specialists Conference, New York, 1995, 164-167.

So et al., "Properties of Reactively Sputtered Mo$_{1-x}$O$_x$ Films," Appl. Phys. A, 1988, 45:265-270.

Stolt et al., "ZnO/CdS/CuInSe$_2$ thin-film solar cells with improved performance," Appl. Phys. Lett., Feb. 8, 1993, 62(6):597-599.

Windischmann, Henry, "Intrinsic Stress in Sputter-Deposited Thin Films," Critical Reviews in Solid State and Materials Science, 1992, 17(6):547-596.

Yun et al., "Fabrication of CIGS solar cells with a Na-doped Mo layer on a Na-free substrate," Thin Solid Films, 2007, 515:5876-5879.

\* cited by examiner

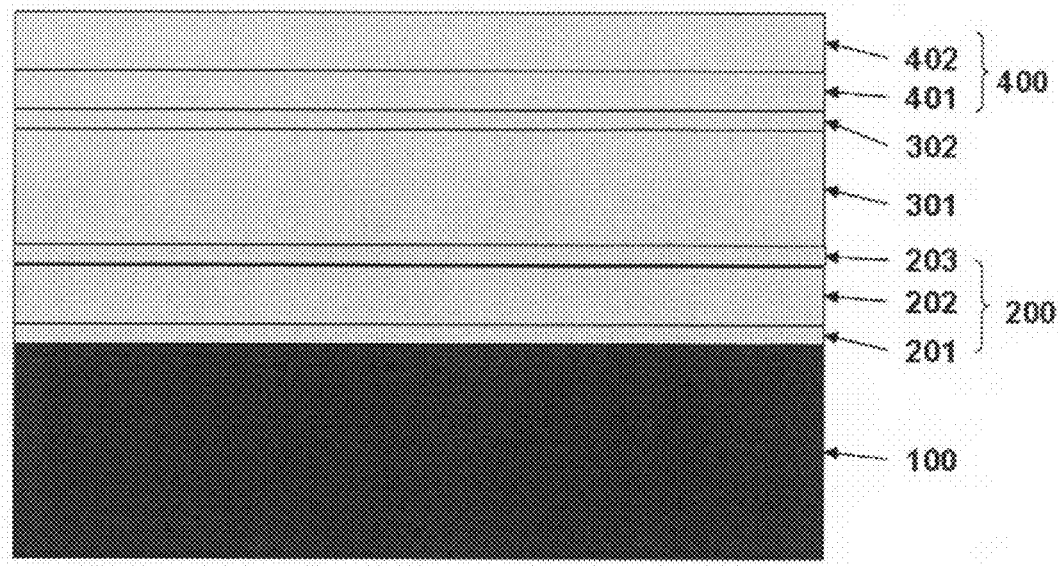

US 7,785,921 B1

BARRIER FOR DOPED MOLYBDENUM TARGETS

FIELD OF THE INVENTION

The present invention relates generally to the field of sputtering targets used in the manufacturing of photovoltaic devices, and more specifically to forming thin-film solar cells by sputter depositing an alkali-containing transition metal electrode.

BACKGROUND OF THE INVENTION

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors.

SUMMARY OF THE INVENTION

One embodiment of this invention provides a sputtering target including a sputtering layer comprising a first material which comprises an alkali-containing transition metal and a support structure comprising a second material, wherein the sputtering layer directly contacts the second material and the second material does not negatively impact the performance of a copper indium selenide (CIS) based semiconductor absorber layer of a solar cell.

Another embodiment of the invention provides a method of manufacturing a sputtering target including forming a sputtering layer comprising a first material which comprises an alkali-containing transition metal directly on a second material of a support structure, wherein the second material does not negatively impact the performance of a copper indium selenide (CIS) based semiconductor absorber layer of a solar cell.

Another embodiment of the invention provides a method of making a solar cell comprising a substrate, a first electrode, at least one p-type semiconductor absorber layer comprising a copper indium selenide (CIS) based alloy material, an n-type semiconductor layer and a second electrode, the method including sputtering the first electrode comprising an alkali-containing transition metal layer from a target. The target may comprise a sputtering layer including a first material which comprises an alkali-containing transition metal sputtering layer and a support structure comprising a second material, wherein the sputtering layer of the target directly contacts the second material. The second material is selected such that atoms which negatively impact the performance of the CIS based alloy material are not incorporated into the p-type semiconductor absorber layer from the alkali containing transition metal layer of the first electrode.

BRIEF DESCRIPTION OF THE DRAWINGS

FIG. 9 is a schematic side cross-sectional view of a CIS based solar cell manufactured according to a method of the present invention.

DESCRIPTION OF THE PREFERRED EMBODIMENTS

Figure 1:
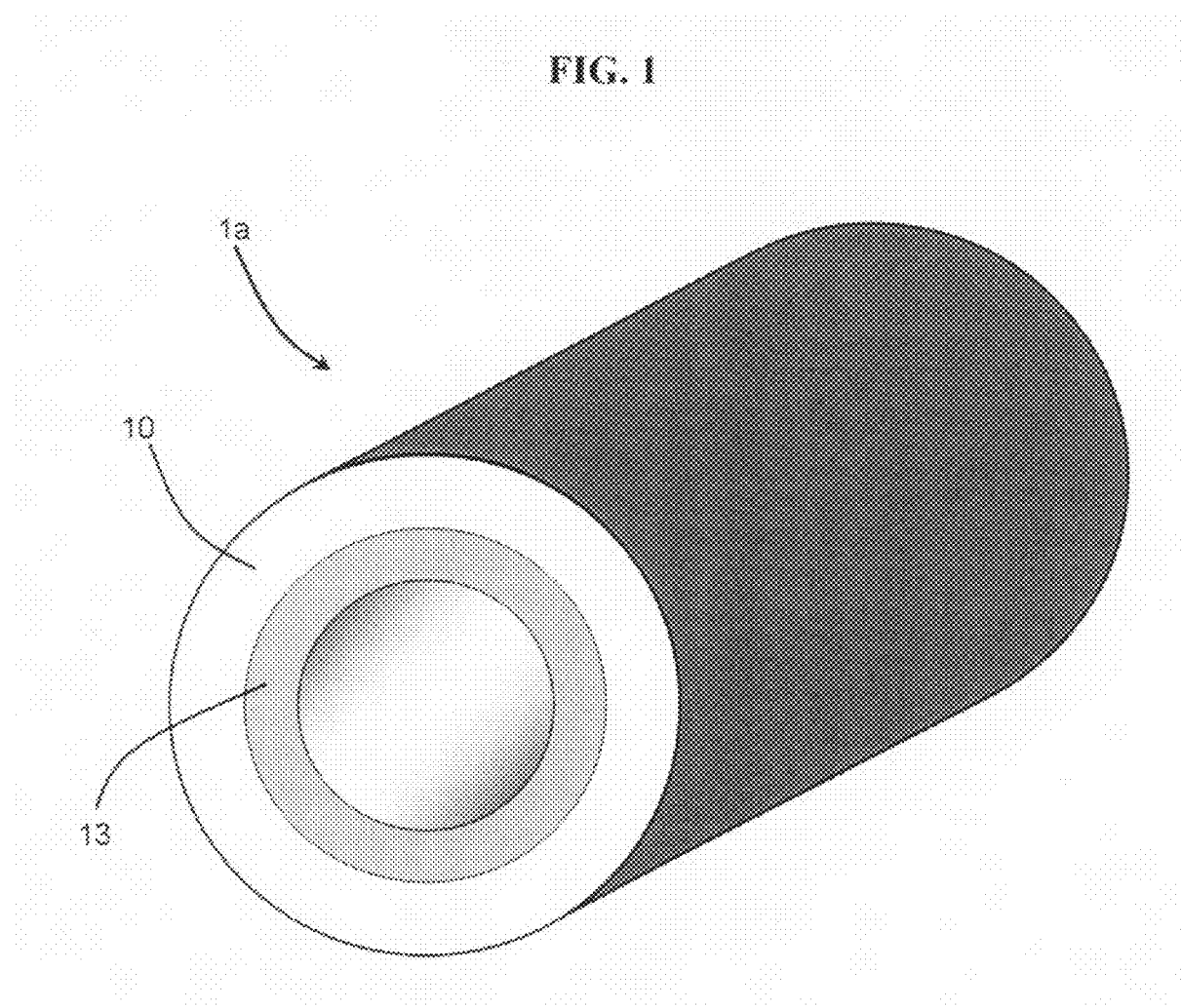
FIG. 1 shows a cross-sectional view of a tubular sputtering target of a first embodiment of the invention.

During production of thin-film solar cells, electrodes may be deposited onto a substrate by sputtering sodium-containing molybdenum (e.g., molybdenum doped with sodium). In some instances, the sputtering target comprises a support, for example a backing layer comprised of stainless steel, and the sodium-containing molybdenum sputtering layer formed over the support.

A sodium and molybdenum premixed powder, such as a powder that comprises a mixture of Mo and a sodium salt, such as $Na_2MoO_4$, is consolidated as a sputtering layer by a high temperature process, at between 500-1500° C. onto a stainless steel support, such as a stainless steel backing tube. Stainless steel comprises iron (Fe) as well as chromium (Cr) and nickel (Ni) alloying elements which are susceptible to migrating into the sodium-containing molybdenum sputtering layer. Once these impurities have diffused into the sodium-containing molybdenum sputtering layer, they may also be sputtered together with the sodium-containing molybdenum during deposition of the electrode of a thin-film solar cell and become incorporated into the electrode. Thereafter, these impurities may migrate into a CIGS absorber layer formed over the electrode, thus significantly decreasing conversion efficiency of the solar cell.

Iron incorporation shifts the electrical/optical properties of a CIGS film, thus resulting in a deteriorated spectral response of a solar cell (see Sakurai et. al., Mater. Res. Soc. Symp. Proc. Vol. 865, F14.12.1)). Similarly, it is believed that diffusion of Ni and Cr atoms may also negatively impact properties of CIS absorber layers. Thus, Fe, Ni and Cr are three elements which negatively impact the performance (such as device efficiency) of a CIS absorber layer.

As used herein, the phrase "does not negatively impact the performance of a CIS absorber layer", or the like, includes the following two definitions. The first definition includes the situation where the diffusion of certain materials into the CIS absorber layer of a solar cell does not impact the absorber layer performance (such as device efficiency). For example, when material originating from a target (such as Mo barrier material) is incorporated into an electrode during sputtering, and subsequently diffuses into the CIS absorber layer of a solar cell, the material does not impact the CIS absorber layer performance in such a way as to reduce device efficiency. The second definition includes the situation where atoms from a target which do negatively impact the performance of a CIS absorber layer do not diffuse or are not incorporated into the CIS absorber layer of a solar cell at all. For example, for a Cr barrier layer under a Mo barrier layer, the Cr does not subsequently diffuse or is not subsequently incorporated into the CIS based absorber layer at all.

To solve the problem of Fe, Ni and/or Cr incorporation in a CIS based absorber layer of a solar cell, one embodiment of the present invention provides a method of making a solar cell formed by depositing a first electrode comprising an alkali-containing transition metal layer over a substrate, depositing at least one p-type semiconductor absorber layer comprising a copper indium selenide (CIS) based alloy material over the first electrode, depositing an n-type semiconductor layer over the p-type semiconductor layer, and depositing a second electrode over the n-type semiconductor layer. If desired, the layers may be deposited in reverse order if a transparent substrate is used. The step of depositing the first electrode comprises sputtering the an alkali-containing transition metal layer from a target by DC sputtering, AC sputtering, or RF sputtering a sputtering layer of a sputtering target.

The target may comprise a sputtering layer comprising a first material, and a support structure comprising a second material. The sputtering layer directly contacts the second material. The second material is selected such that atoms which negatively impact the performance of the CIS based alloy material, such as Fe, Ni and/or Cr, are not incorporated into the p-type semiconductor absorber layer from the alkali containing transition metal layer of the first electrode.

The sputtering layer may comprise a first material comprising an alkali-containing transition metal. The transition metal of the alkali-containing transition metal sputtering layer may be one of Mo, W, Ta, V, Ti, Nb, Zr, or alloys thereof. The alkali metal of the alkali-containing transition metal sputtering layer may be one of Li, Na, K, or combinations thereof. In one embodiment, the alkali-containing transition metal layer comprises molybdenum intentionally doped with at least one alkali element, such as sodium (herein referred to as sodium-containing molybdenum). An example of a sodium-containing molybdenum sputtering layer comprises $Na_2MoO_4$ combined with Mo. Also, in embodiments of the present invention, the first material of the sputtering layer may comprise 0.5 to 10 wt % sodium, 0-50 wt % oxygen and the balance molybdenum. The present inventors have found that Fe, Ni, and Cr diffuse more readily into sodium-containing molybdenum than into Mo alone. Thus, while contact between stainless steel and a Mo sputtering layer is acceptable, contact between stainless steel and a sodium-containing molybdenum sputtering layer leads to contamination of the sputtering layer with one or more of Fe, Ni and Cr.

In a first embodiment of the invention, the second material of the target support structure comprises a material other than stainless steel, such as Mo. Generally, however, the second material of the target support structure may be selected from a group consisting of Mo, W, Ta, V, Ti, Nb, Zr, alloys thereof and nitrides thereof, rather than stainless steel.

In a second embodiment of the present invention, the support structure of the target may comprise at least one barrier layer comprising the second material formed on a backing structure of a third material, such as stainless steel, that is different from the second material. The barrier layer is capable of blocking diffusion of atoms, for example Fe, Ni and/or Cr from the backing structure into the sputtering layer.

For example, the backing structure may comprise stainless steel while the barrier layer is capable of blocking diffusion of at least one of Fe, Ni or Cr atoms (which could otherwise negatively impact the performance of the CIS based semiconductor absorber layer) from the stainless steel toward the sputtering layer of the target. The barrier layer may comprise one or more layers of Mo, W, Ta, V, Ti, Nb, Zr, alloys thereof and nitrides thereof. For example, the barrier layer may comprise a first barrier layer comprising Cr formed directly on and in contact with a backing structure comprising stainless steel, and a second barrier layer comprising Mo. The second barrier layer is formed between the first barrier layer and a sputtering layer comprising sodium-containing molybdenum. In some embodiments, an additional third barrier layer comprising Nb is formed between the second barrier layer and the sputtering layer.

In some sputtering systems, tubular rotatable targets are used while in others, planar or stacked targets are used. For example, U.S. Pat. No. 4,356,073, which is hereby incorporated by reference herein in its entirety, discloses a rotatable tubular target. Also, U.S. Pat. No. 5,904,966, which is incorporated by reference herein in its entirety, provides a multi-layer target as a rotatable or static tubular structure, or alternatively, in the form of a flat plate. Thus, embodiments of the present invention provide either a rotatable or static tubular sputtering target, such as comprising a backing structure as a hollow support tube, or a planar sputtering target comprising a backing structure as a planar support plate.

One advantage of the second embodiment of the invention is a sputtering target having a barrier layer capable of blocking diffusion of materials from a backing structure that could otherwise negatively impact the performance of the CIS based semiconductor absorber layer of a solar cell. For example, by providing a sputtering layer over a barrier layer capable of blocking at least one of Fe, Ni or Cr atoms that can otherwise diffuse from a stainless steel backing structure toward the sputtering layer, the concentration of these atoms in the sputtering layer of the target is thereby minimized. For example, the term capable of blocking means that the concentration of Fe, Ni or Cr atoms in the sputtering layer is decreased by at least an order of magnitude relative to a sputtering target with no such barrier layer. Thus, when the sputtering layer of the target is sputtered to form the first electrode, the concentration of Fe, Ni or Cr in the resulting first electrode is also minimized. Therefore the diffusion of Fe, Ni or Cr to the CIS based semiconductor absorber layer of the solar cell deposited over the first electrode is also minimized.

For example, as illustrated in FIG. 1, a sputtering target 1a of a first embodiment of the invention includes a sputtering layer 10 comprising a first material which comprises an alkali-containing transition metal and a support structure 13 comprising a second material. The sputtering layer 10 directly contacts the second material and the second material does not negatively impact the performance of a copper indium selenide (CIS) based semiconductor absorber layer of a solar cell. In the embodiment illustrated in FIG. 1, the support structure 13 comprises a backing structure tube comprising the second material. In other words, the backing structure tube comprises Mo, W, Ta, V, Ti, Nb, Zr, alloys thereof or nitrides thereof. A sodium-containing molybdenum sputtering layer 10 is formed directly on such backing structure.

Figure 2:
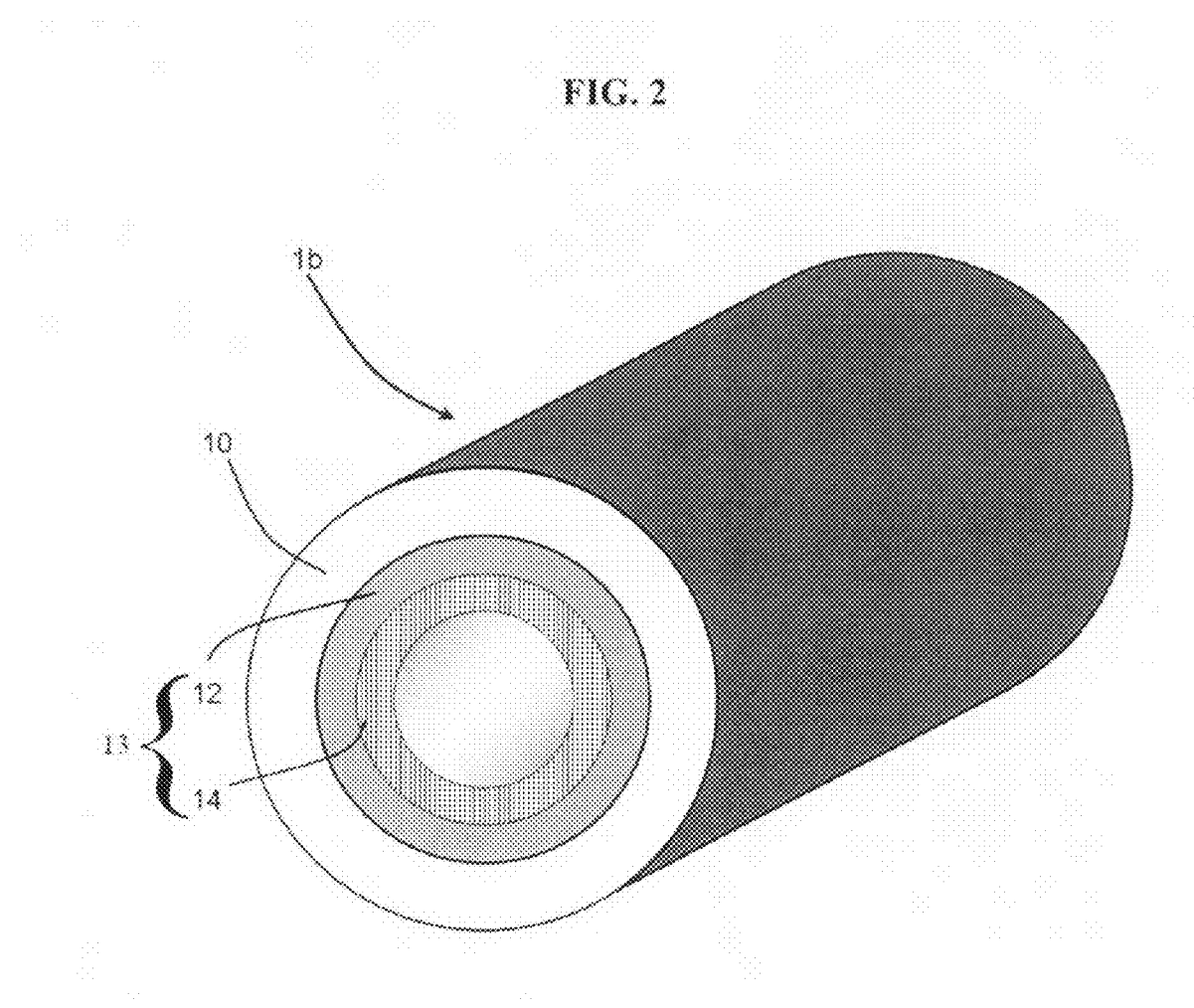
FIG. 2 shows a cross-sectional view of a tubular sputtering target of a second embodiment of the invention comprising a barrier layer.

The support structure of a second embodiment of the invention comprises one or more barrier layers. For example, as illustrated in FIG. 2, a sputtering target 1b of a second embodiment of the invention comprises a multi-layer tubular structure comprising sputtering layer 10 and a support structure 13. Sputtering layer 10 may comprise a first material which comprises an alkali-containing transition metal, such as sodium-containing molybdenum, and the support structure 13 may comprise a second material barrier layer 12 on a backing structure 14. In this embodiment, the sputtering layer 10 directly contacts the second material 12 formed on the backing structure 14 comprising stainless steel or a similar Fe, Ni or Cr material. Barrier layer 12 may be a foil or a deposited layer.

Figure 3:
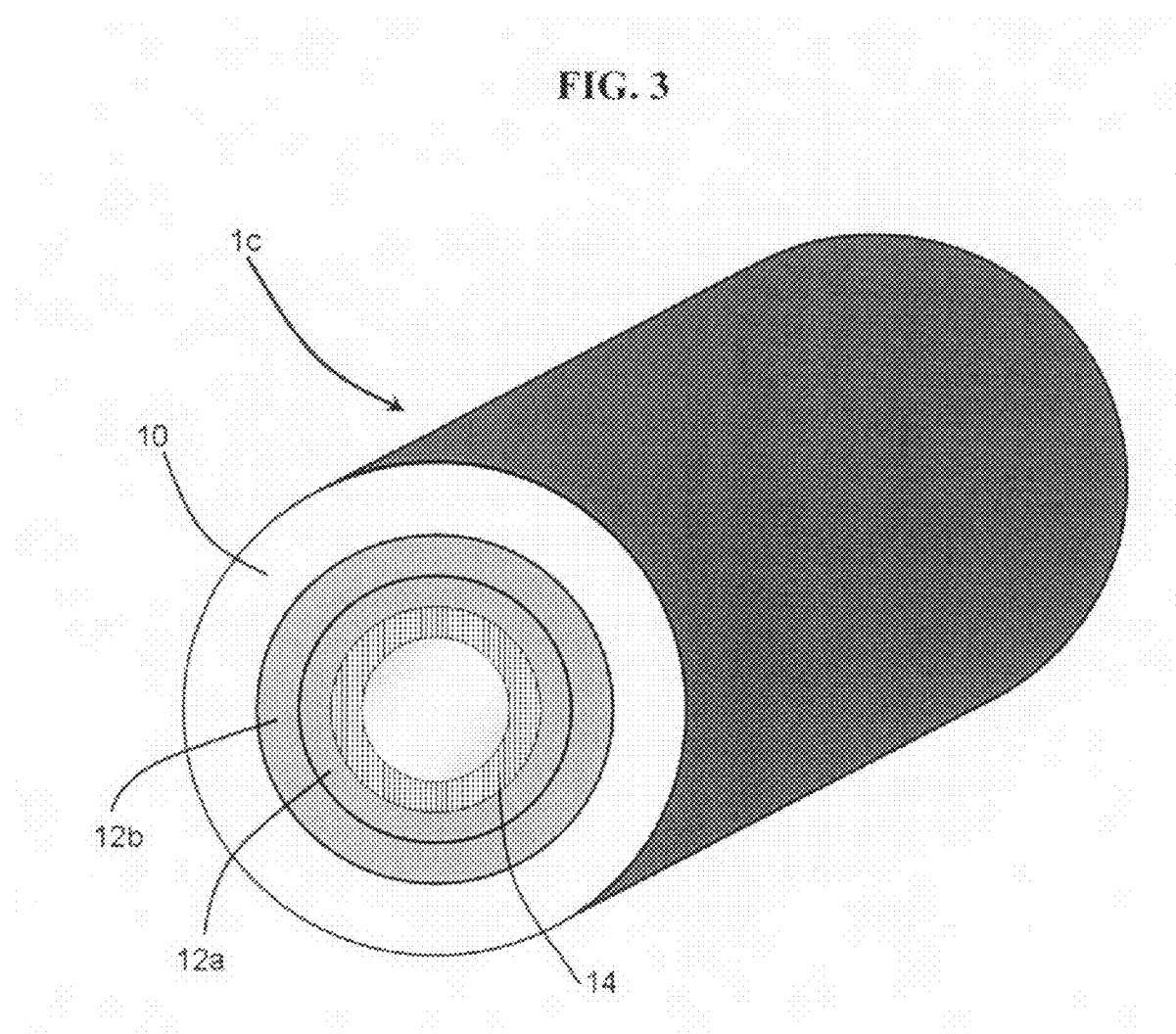
FIG. 3 shows a cross-sectional view of an alternate tubular sputtering target of the second embodiment of the invention comprising two barrier layers.
Figure 4:
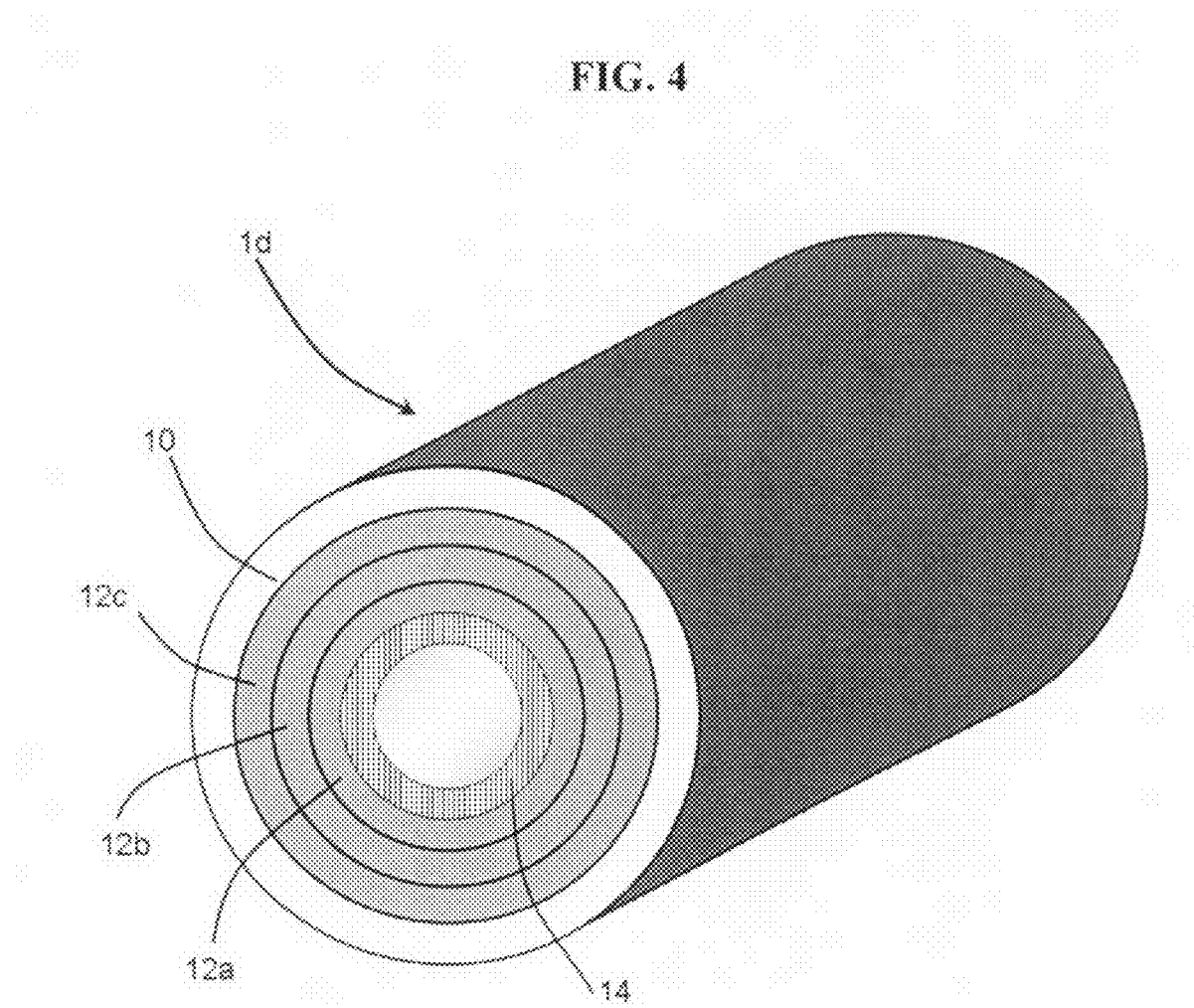
FIG. 4 shows a cross-sectional view of a tubular sputtering target of the second embodiment of the invention comprising three barrier layers.

FIG. 3 illustrates an alternative embodiment of a sputtering target 1c of the present invention having a similar tubular structure as that of FIG. 2 except that barrier layer comprises a first barrier layer 12a and a second barrier layer 12b. The first barrier layer 12a may comprise Cr and the second barrier layer 12b may comprise Mo. Additionally, as illustrated in FIG. 4, a sputtering target 1d may have a similar structure as the sputtering target 1c with the addition of a third barrier layer 12c comprising Nb formed between the second barrier layer 12b and the sputtering layer 10.

Figure 5:
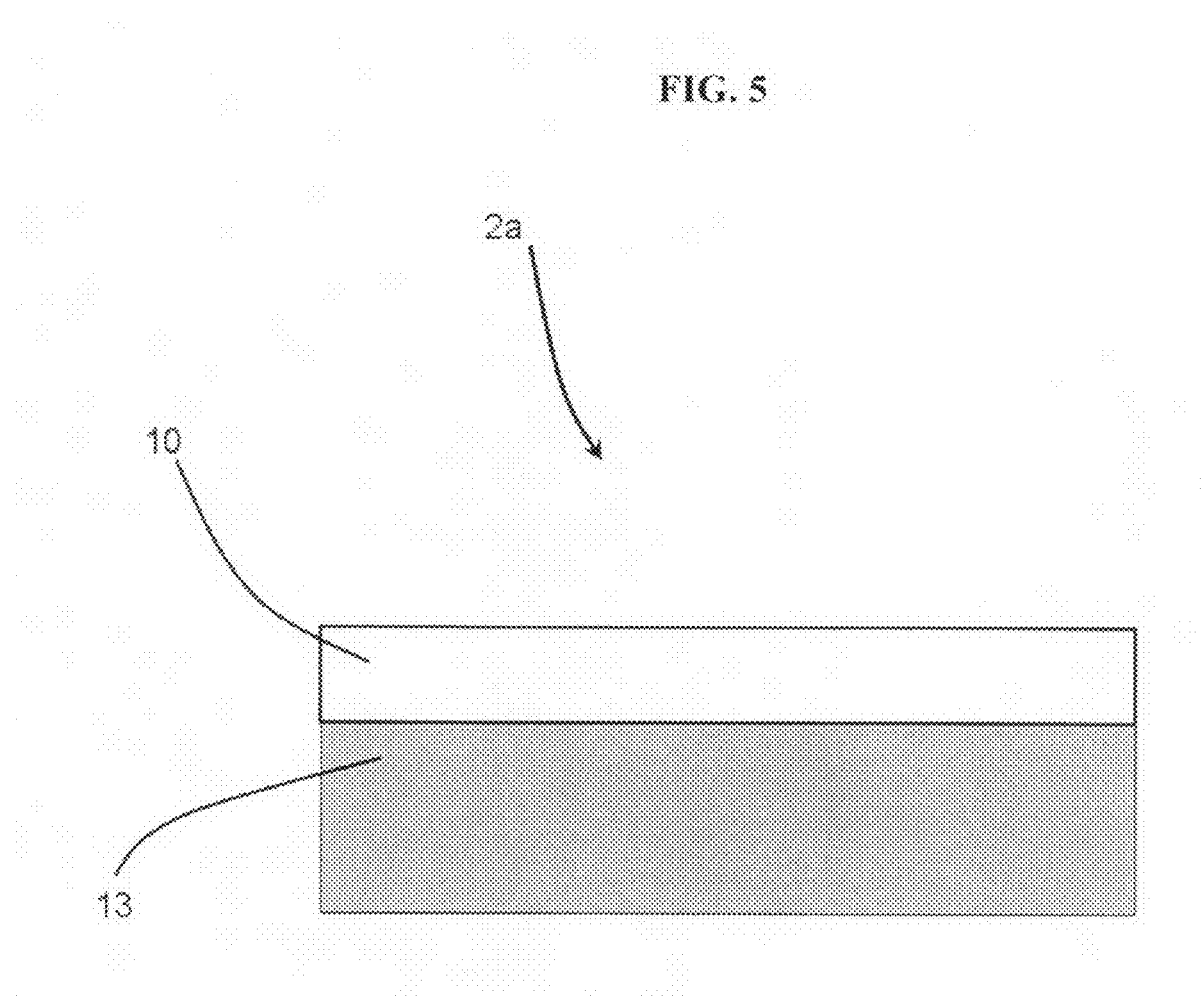
FIG. 5 shows a cross-sectional view of a planar sputtering target of a third embodiment the invention.
Figure 6:
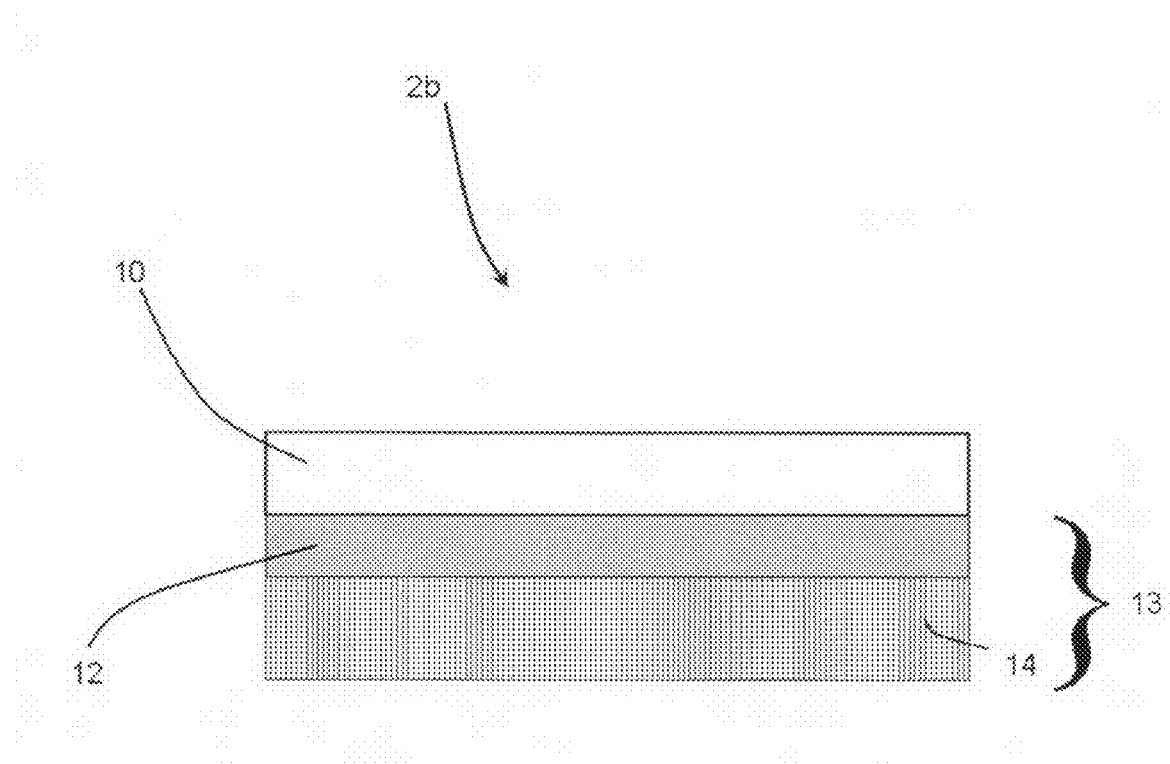
FIG. 6 shows a cross-sectional view of a planar sputtering target of the third embodiment of the invention comprising a barrier layer.
Figure 7:
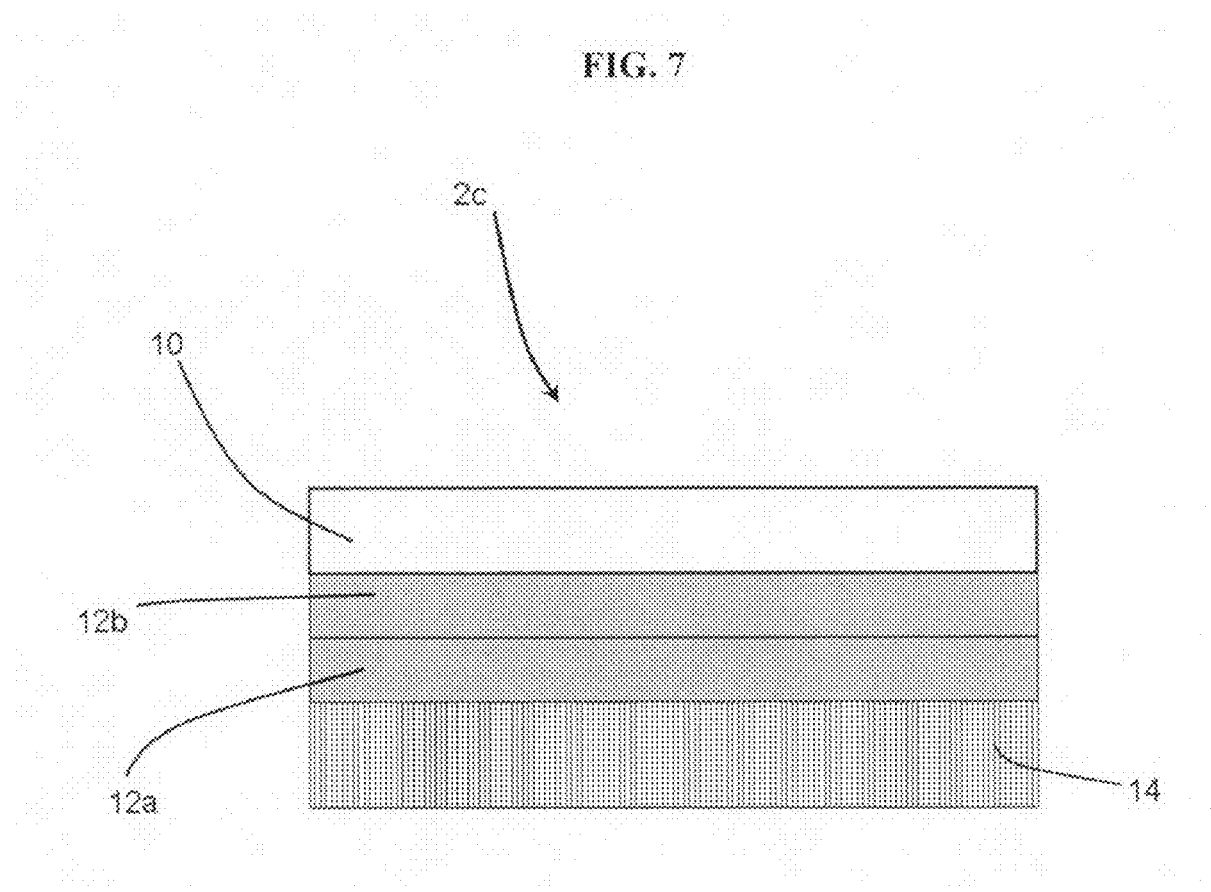
FIG. 7 shows a cross-sectional view of an alternate planar sputtering target of the third embodiment of the invention comprising two barrier layers.

Rather than providing a tubular target, a third embodiment of a sputtering target of the present invention is provided as a planar sputtering target. For example, FIG. 5 illustrates a planar sputtering target 2a comprising a similar multilayer configuration as the sputtering target illustrated in FIG. 1 except that all layers are planar shaped rather than having an annular shape. Alternatively, as illustrated in FIG. 6, planar sputtering target 2b comprises a barrier layer 12 formed over a backing structure 14 and a sputtering layer 10 formed over the barrier layer 12 as a planar version of the multilayer configuration of the sputtering target of FIG. 2. Additionally, a planar sputtering target 2c illustrated in FIG. 7 comprises multiple barrier layers. For example a first barrier layer 12a is formed over backing structure 14, and a second barrier layer 12b is formed between first barrier layer 12a and sputtering layer 10 as a planar version of the multilayer configuration of the tubular sputtering target of FIG. 3.

While the embodiments with respect to sputtering targets 1a, 1b, 1c, 1d, 2a, 2b and 2c have been described with up to three barrier layers comprising specific barrier materials, for example a first barrier layer comprising Cr, a second barrier layer comprising Mo and a third barrier layer comprising Nb, the invention is not so limited. In fact, the present invention may generally comprise any number of barrier layers (including no barrier layers), at least one of which may comprise at least one of Cr, Mo and Nb. Other barrier layers comprising materials that are capable of preventing the diffusion of atoms to the sputtering layer that are deleterious to the absorber layer of a solar cell may also be used.

The barrier layer(s) 12 may be formed on the backing structure by any suitable method. For example, the barrier layer may be formed as a film of about at least 1 μM in thickness by depositing the second material onto the backing structure by sputtering, pressing or thermal spraying (including coating processes selected from the group comprising plasma spray, cold spray, high velocity oxygen fuel ("HVOF"), twin wire arc spray ("TWAS") and flame spray). Alternatively, the barrier may be formed by providing a barrier foil having a thickness of about 1-1000 attaching the barrier foil to the backing structure to form the barrier layer, and hot pressing the first material (e.g., a sodium and molybdenum premixed powder, or sodium-containing molybdenum) to the barrier layer to form the sputtering layer and to bond the barrier layer to the backing structure. The process of hot pressing the first material to the barrier layer may include a number of conventional methods such as vacuum hot pressing, hot isostatic pressing ("HIP"), uniaxial pressing, or the like.

Figure 8A:
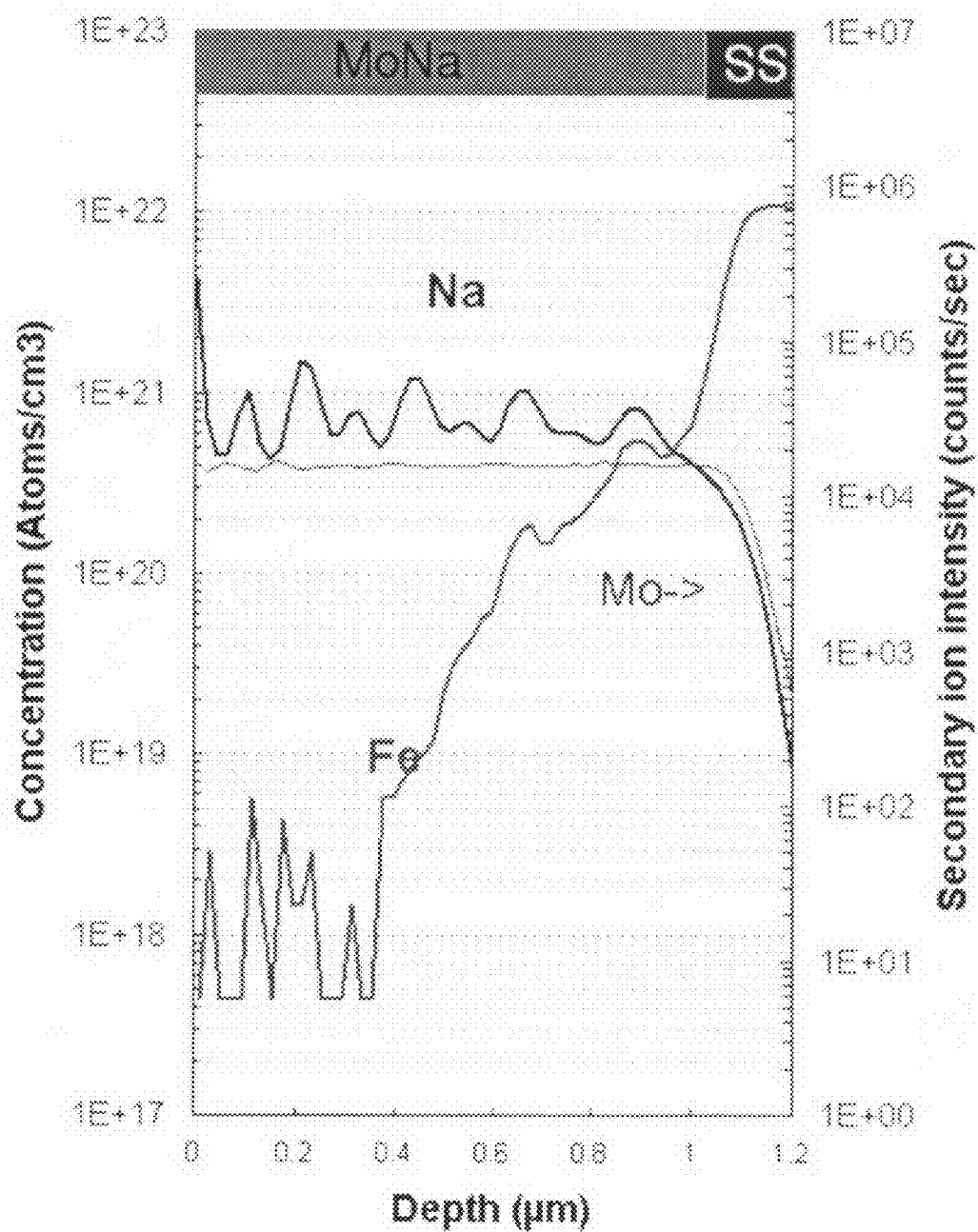
FIG. 8a shows a Secondary Ion Mass Spectrometry (SIMS) spectra result of a comparative low temperature thin film example.

Comparative Low-Temperature Thin Film Example:

An about 1.1-1.2 μm layer of sodium-containing molybdenum was deposited on a bare 430 SST stainless steel substrate and annealed at 400° C. for one hour thereby forming a thin-film sample. FIG. 8a is a SIMS depth profile of this comparative sputtering target showing that sodium-containing molybdenum alone is not capable of blocking the diffusion of Fe atoms from the stainless steel backing layer.

Figure 8B:
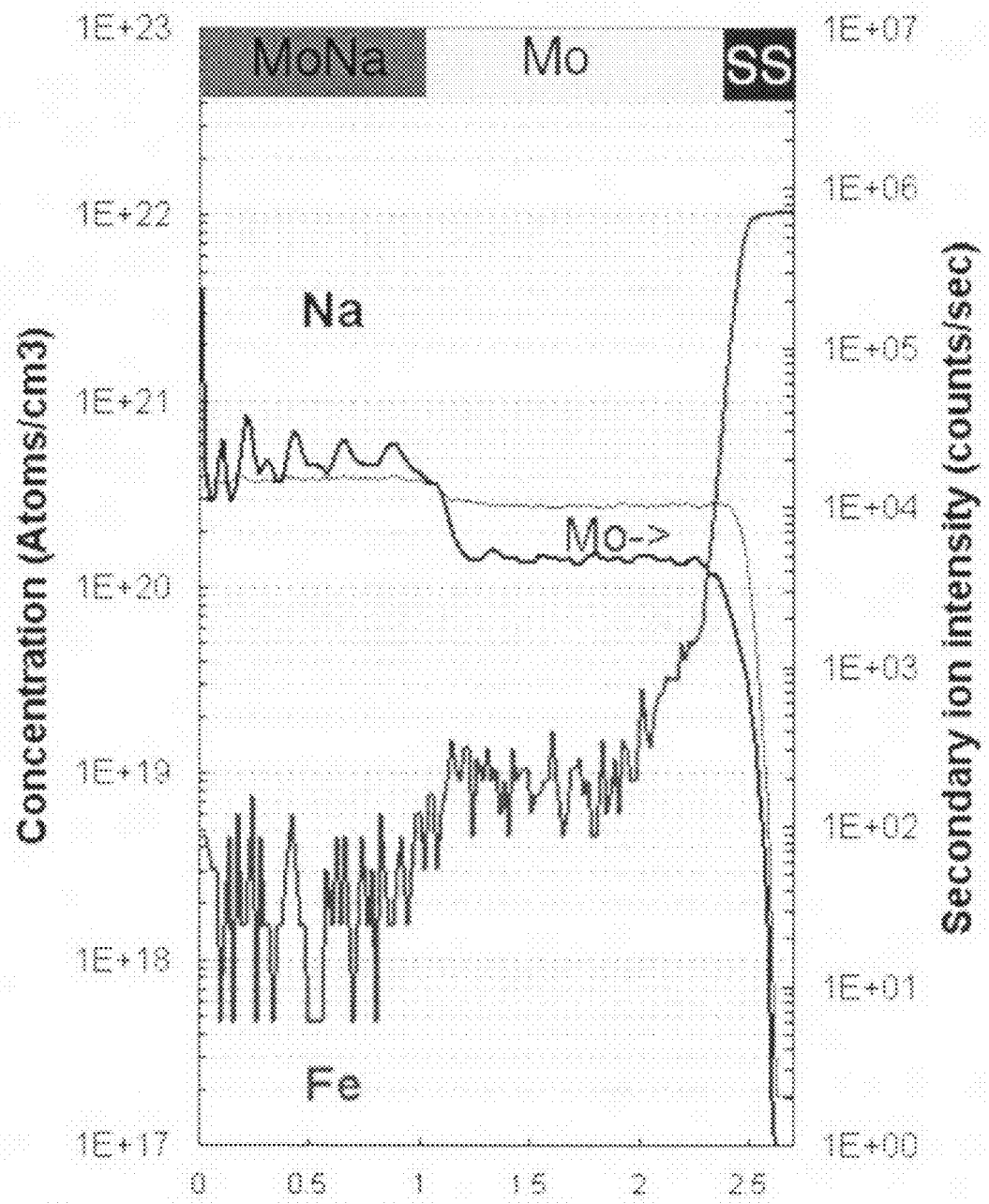
FIG. 8b shows a SIMS spectra result of a first exemplary low temperature thin film example.

First Exemplary Low-Temperature Thin Film Example:

An about 1.3 μm barrier layer of Mo was deposited on a bare 430 SST stainless steel substrate. An about 1.1-1.2 μm layer of sodium-containing molybdenum was deposited on the Mo layer and annealed at 400° C. for one hour thereby forming a first thin-film sample. FIG. 8b is a SIMS depth profile of this first sample showing that a Mo barrier layer is capable of reducing the diffusion of Fe atoms from the stainless steel backing layer toward the sodium-containing molybdenum sputtering layer. It is noted that this first thin-film example comprises a configuration of layers similar to those of some embodiments of sputtering targets of the present invention, and is only provided as an example which is not intended to limit the present invention.

Figure 8C:
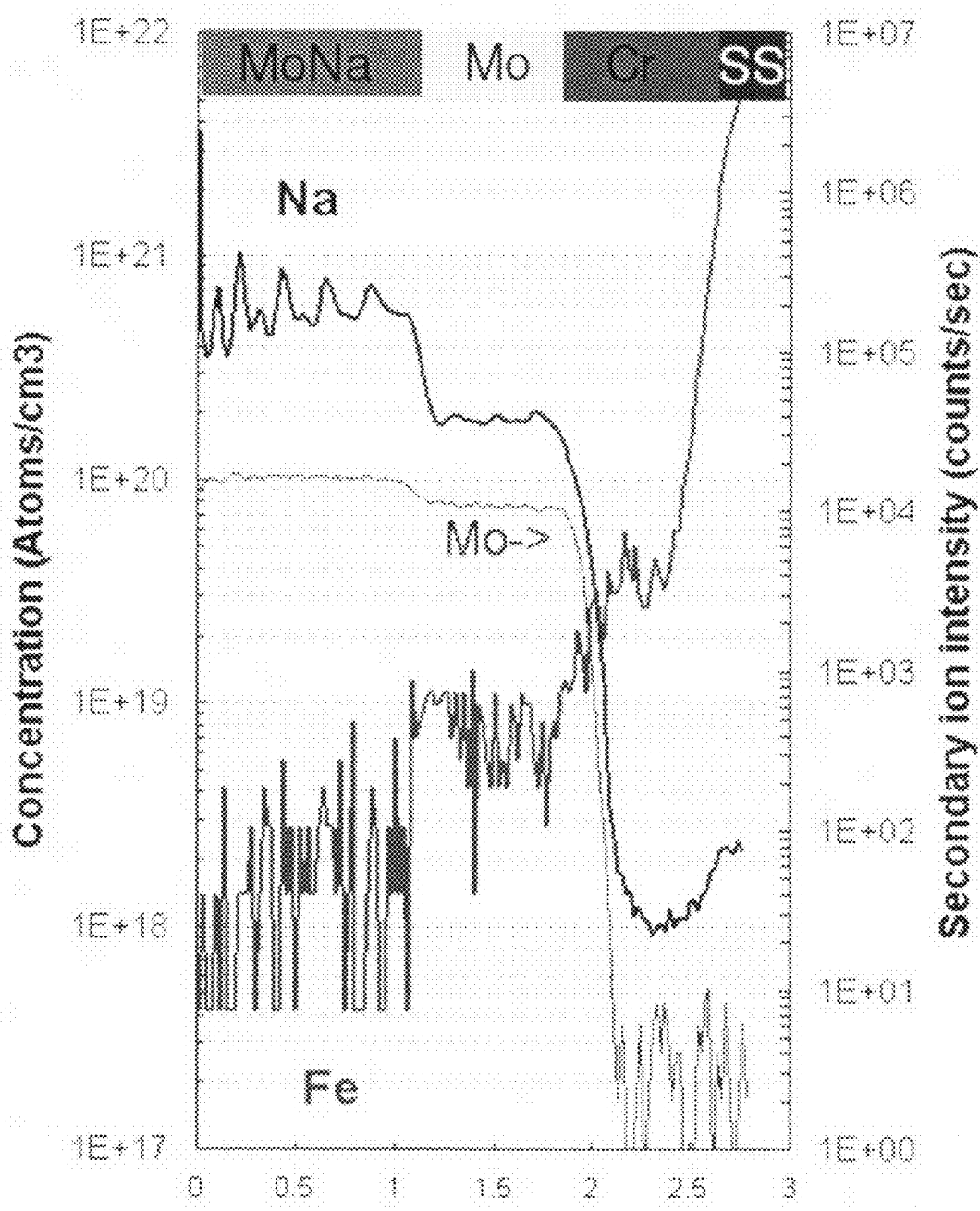
FIG. 8c shows a SIMS spectra result of a second exemplary low temperature thin film example.

Second Exemplary Low-Temperature Thin Film Example:

An about 0.6 μm first barrier layer of Cr was deposited on a bare 430 SST stainless steel substrate. An about 0.7 μm second barrier layer of Mo was deposited over the first barrier layer. An about 1.1-1.2 μm layer of sodium-containing molybdenum was then deposited on the second barrier layer. The deposited layers were then annealed at 400° C. for one hour thereby forming a second thin-film sample. FIG. 8c is a SIMS depth profile of this second sample showing that the Cr and Mo barrier layers are capable of reducing the diffusion of Fe atoms from the stainless steel backing layer toward the sodium-containing molybdenum layer. It is noted that this second example comprises a configuration of layers similar to those of some embodiments of sputtering targets of the present invention, and is only provided as an example which is not intended to limit the present invention.

In summary, as shown in the SIMS depth profiles through a comparative sample of a sputtering target, as shown in FIG. 8a, Fe substantially diffuses into sodium-containing molybdenum even at a temperature as low as 400° C., which is a lower temperature is utilized in several high temperature pressing processes (conventionally at 500-1500° C.) used to manufacture targets. As shown in FIGS. 8a and 8b, a Mo barrier layer reduces Fe concentration in sodium-containing molybdenum by one to two orders of magnitude. For example, the concentration of Fe is greater than about $1 \times 10^{20}$ atoms/cm$^3$, such as about $10^{20}$-$10^{21}$ atoms/cm$^3$ in sodium-containing molybdenum, but $10^{19}$-$10^{20}$ in Mo. As shown in FIG. 8c, a barrier formed of a first barrier layer comprising Cr and a second barrier layer comprising Mo also reduces Fe diffusion. The reduction should be even more pronounced for sputtering layers formed at a higher temperature, such as by a vacuum hot pressing, uniaxial pressing or HIP process.

The sputtering target of the embodiments of the invention may be used in any suitable solar cell or other device which is made by a manufacturing process comprising a sputtering step. For example, as illustrated in FIG. 9, the method of making a solar cell comprises providing a substrate 100, and depositing a first (lower) electrode 200 over the substrate.

Optionally, the first electrode 200 of the solar cell may comprise one or more barrier layers 201 located under the alkali-containing transition metal layer 202, and/or one or more adhesion layers 203 located over the alkali-containing transition metal layer 202. In some embodiments, the barrier layer 201 is denser than the adhesion layer 203, and substantially prevents alkali diffusion from the alkali-containing transition metal layer 202 into the substrate 100. In these embodiments, alkali may diffuse from the alkali-containing transition metal layer 202, through the lower density adhesion layer 203, into the at least one p-type semiconductor absorber layer 301 during and/or after the step of depositing the at least one p-type semiconductor absorber layer 301. The optional barrier layer 201 and adhesion layer 203 may comprise any suitable materials. For example, they may be independently selected from a group consisting Mo, W, Ta, V, Ti, Nb, Zr, Cr, TiN, ZrN, TaN, VN, $V_2N$ or combinations thereof. In one embodiment, while the barrier layer 201 may be oxygen free, the alkali-containing transition metal layer 202 and/or the adhesion layer 203 may contain oxygen and/or be deposited at a higher pressure than the barrier layer 201 to achieve a lower density than the barrier layer 201.

Alternatively, the optional one or more barrier layers 201 and/or optional one or more adhesion layers 203 may be omitted. When the optional one or more adhesion layers 203 are omitted, the at least one p-type semiconductor absorber layer 301 is deposited over the alkali-containing transition metal layer 202, and alkali may diffuse from the alkali-containing transition metal layer 202 into the at least one p-type semiconductor absorber layer 301 during or after the deposition of the at least one p-type semiconductor absorber layer 301.

In preferred embodiments, the p-type semiconductor absorber layer 301 may comprise a CIS based alloy material selected from copper indium selenide, copper indium gallium selenide, copper indium aluminum selenide, or combinations thereof. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom for each one of Group III atom and each two of Group VI atoms. The step of depositing the at least one p-type semiconductor absorber layer may comprise reactively AC sputtering the semiconductor absorber layer from at least two electrically conductive targets in a sputtering atmosphere that comprises argon gas and a selenium containing gas (e.g. selenium vapor or hydrogen selenide). For example, each of the at least two electrically conductive targets comprises copper, indium and gallium; and the CIS based alloy material comprises copper indium gallium diselenide.

An n-type semiconductor layer 302 may then be deposited over the p-type semiconductor absorber layer 301. The n-type semiconductor layer 302 may comprise any suitable n-type semiconductor materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode is deposited over a substrate, followed by depositing an n-type semiconductor layer over the transparent electrode, depositing at least one p-type semiconductor absorber layer over the n-type semiconductor layer, and depositing a top electrode comprising an alkali-containing transition metal layer over the at least one p-type semiconductor absorber layer. The substrate may be a transparent substrate (e.g., glass) or opaque (e.g., metal). If the substrate used is opaque, then the initial substrate may be delaminated after the steps of depositing the stack of the above described layers, and then bonding a glass or other transparent substrate to the transparent electrode of the stack.

More preferably, the steps of depositing the first electrode 200, depositing the at least one p-type semiconductor absorber layer 301, depositing the n-type semiconductor layer 302, and depositing the second electrode 400 comprise sputtering the alkali-containing transition metal layer 202, the p-type absorber layer 301, the n-type semiconductor layer 302 and one or more conductive films of the second electrode 400 over the substrate 100 (preferably a web substrate in this embodiment) in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules. Each of the process modules may include one or more sputtering targets for sputtering material over the web substrate 100.

As discussed above, the first electrode may comprise an alkali-containing transition metal layer which is formed by sputtering from a target of one of the embodiments of the present invention. For example, the first electrode may be formed by sputtering from a target that comprises a sputtering layer comprising a first material. The first material may comprise an alkali containing transition metal sputtering layer. The target may additionally comprise a support structure comprising a second material. The sputtering layer of the target may directly contact the second material, and the second material is selected such that atoms which negatively impact the performance of the p-type absorber layer are not incorporated into the p-type semiconductor absorber layer from the alkali containing transition metal layer of the first electrode.

Figure 10:
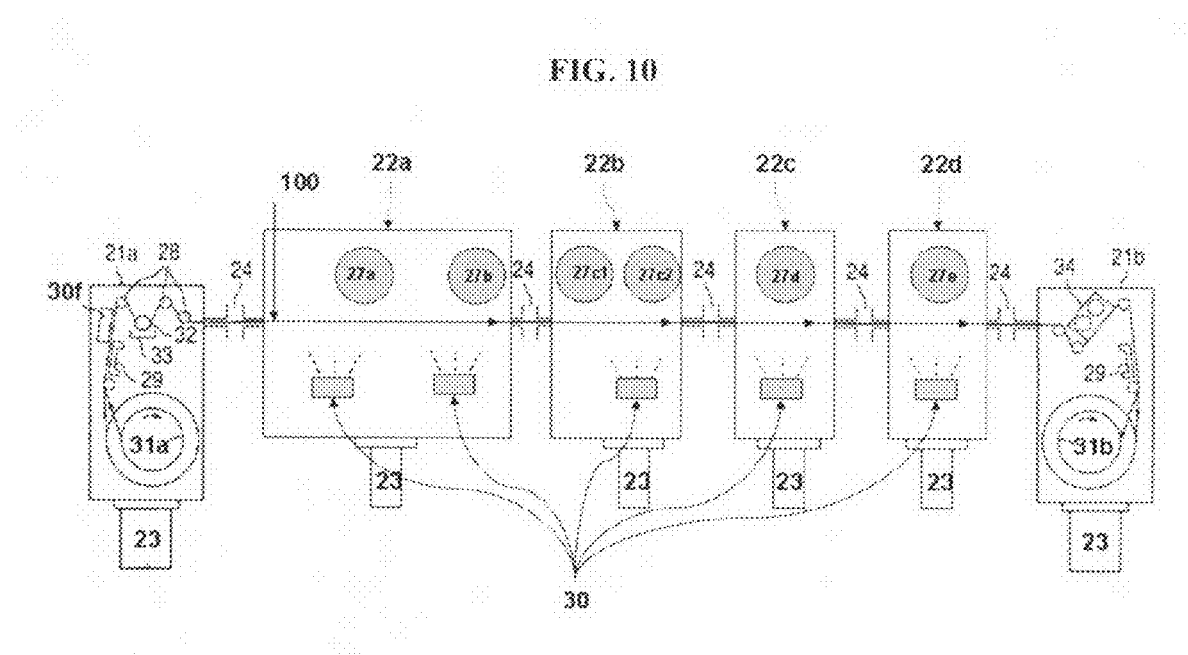
FIG. 10 shows a highly simplified schematic diagram of a top view of a modular sputtering apparatus that can be used to manufacture the solar cell depicted in FIG. 9 according to a method of an embodiment of the present invention.

A modular sputtering apparatus for making the solar cell, as illustrated in FIG. 10 (top view), may be used for depositing the layers of the solar cell discussed above. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Published Application No. 2005/0109392 A1 ("Hollars"), filed on Oct. 25, 2004, discloses a vacuum sputtering apparatus having connected modules, and is incorporated herein by reference in its entirety.

The web substrate 100 is moved throughout the machine by rollers 28, or other devices. Additional guide rollers may be used. Rollers shown in FIG. 10 are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 10, the heaters are placed on one side of the web 100, and sputtering targets 27 a-e are placed on the other side of the web 100. Sputtering targets 27 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

Next, the web 100 passes into the process modules 22a through valve 24. Following the direction of the imaginary arrows along the web 100, the full stack of layers may be deposited in one continuous process. The first electrode 202 may be sputtered in the process module 22a over the web 100, as illustrated in FIG. 10. Optionally, the process module 22a may include more than one target, for example a first alkali-containing transition metal target 27a and a second alkali-containing transition metal target 27b, arranged in such a way that each alkali-containing transition metal target has a composition different from that of the transition metal target. Furthermore, targets 27a and 27b may be selected from the targets of the various embodiments of the present invention, for example any of targets 1a-d, or 2a-c as illustrated in FIGS. 1-7.

The web 100 then passes into the next process module, 22b, for deposition of the at least one p-type semiconductor absorber layer 301. In a preferred embodiment shown in FIG. 8, the step of depositing the at least one p-type semiconductor absorber layer 301 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 30 maintain the web at the required process temperature, for example, around 400-800° C., for example around 500-700° C., which is preferable for the CIS based alloy deposition.

In some embodiments, at least one p-type semiconductor absorber layer 301 may comprise graded CIS based material. In this embodiment, the process module 22b further comprises at least two more pairs of targets (227, and 327), as illustrated in FIG. 4. The first magnetron pair 127 (27c1 and 27c2) are used to sputter a layer of copper indium diselenide while the next two pairs 227, 327 of magnetrons targets (27c3, 27c4 and 27c5, 27c6) sputter deposit layers with increasing amounts of gallium (or aluminum), thus increasing and grading the band gap. The total number of targets pairs may be varied, for example may be 2-10 pairs, such as 3-5 pairs. This will grade the band gap from about 1 eV at the bottom to about 1.3 eV near the top of the layer. Details of depositing the graded CIS material is described in the Hollars published application, which is incorporated herein by reference in its entirety.

Optionally, one or more process modules (not shown) may be added between the process modules 21a and 22a to sputter a back side protective layer over the back side of the substrate 100 before the electrode 200 is deposited on the front side of the substrate. U.S. application Ser. No. 12/379,428 titled "Protective Layer for large-scale production of thin-film solar cells" and filed on Feb. 20, 2009, which is hereby incorporated by reference, describes such deposition process. Further, one or more barrier layers 201 may be sputtered over the front side of the substrate 100 in the process module(s) added between the process modules 21a and 22a. Similarly, one or more process modules (not shown) may be added between the process modules 22a and 22b, to sputter one or more adhesion layers 203 between the alkali-containing transition metal layer 202 and the CIGS layer 301.

The web 100 may then pass into the process modules 22c and 22d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more Anti-Reflection (AR) layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A method of forming a sputtering target, comprising:
   forming a sputtering layer comprising a first material which comprises an alkali-containing transition metal directly on a second material of a support structure, wherein:
   the second material does not negatively impact a performance of a copper indium selenide (CIS) based semiconductor absorber layer of a solar cell;
   the support structure comprises a barrier layer comprising the second material formed on a backing structure of a third material that is different from the second material;
   the first material comprises a transition metal selected from a group consisting of Mo, W, Ta, V, Ti, Nb, Zr and alloys thereof, and an alkali metal selected from a group consisting of Li, Na, and K;
   the second material is selected from a group consisting of Mo, W, Ta, V, Ti, Nb, Zr, alloys thereof and nitrides thereof;
   the backing structure comprises stainless steel; and
   the barrier layer is capable of blocking diffusion of at least one of Fe, Ni or Cr atoms which negatively impact the performance of the CIS based semiconductor absorber layer from the stainless steel toward the sputtering layer.

2. The method of claim 1, wherein:
   the backing structure comprises a planar support plate or a hollow support tube; and
   the barrier layer is formed between the sputtering layer and the backing structure.

3. The method of claim 2, further comprising forming the barrier layer by depositing the second material onto the backing structure.

4. The method of claim 3, wherein the depositing is done by sputtering or thermal spraying.

5. The method of claim 2, further comprising:
   providing a barrier foil;
   attaching the barrier foil to the backing structure to form the barrier layer; and
   hot pressing the first material to the barrier layer to form the sputtering layer and to bond the barrier layer to the backing structure.

6. The method of claim 1, wherein the first material comprises 0.5 to 10 wt % sodium, 0-50 wt % oxygen and balance molybdenum.

7. A method of making a solar cell comprising a substrate, a first electrode, at least one p-type semiconductor absorber layer comprising a copper indium selenide (CIS) based alloy material, an n-type semiconductor layer and a second electrode, the method comprising:
   sputtering the first electrode comprising an alkali-containing transition metal layer from a target comprising:
   a sputtering layer comprising a first material which comprises an alkali-containing transition metal sputtering layer; and
   a support structure comprising a second material, wherein the sputtering layer of the target directly contacts the second material;
   wherein the second material is selected such that atoms which negatively impact a performance of the CIS based alloy material are not incorporated into the p-type semiconductor absorber layer from the alkali containing transition metal layer of the first electrode.

8. The method of claim 7, wherein the method comprises:
   depositing the first electrode over the substrate;
   depositing the at least one p-type semiconductor absorber layer over the first electrode;
   depositing the n-type semiconductor layer over the at least one p-type semiconductor absorber layer; and
   depositing the second electrode over the n-type semiconductor layer.

9. The method of claim 7, wherein:
   the support structure comprises a barrier layer comprising the second material formed on a backing structure of a third material that is different from the second material; and
   the barrier layer blocks diffusion of the atoms which negatively impact the performance of the CIS based alloy material from the backing structure into the sputtering layer such that the atoms which negatively impact the performance of the CIS based alloy material are not incorporated into the alkali containing transition metal layer of the first electrode during the step of sputtering the first electrode and do not diffuse from the first electrode into the at least one p-type semiconductor absorber layer.

10. The method of claim 9, wherein:
    the backing structure comprises a planar support plate or a hollow support tube;
    the barrier layer is formed between the sputtering layer and the backing structure;
    the first material comprises a transition metal selected from a group consisting of Mo, W, Ta, V, Ti, Nb, Zr and alloys thereof, and an alkali metal selected from a group consisting of Li, Na, and K;
    the second material is selected from a group consisting of Mo, W, Ta, V, Ti, Nb, Zr, alloys thereof and nitrides thereof;
    the backing structure comprises stainless steel; and
    the barrier layer is capable of blocking diffusion of at least one of Fe, Ni or Cr atoms which negatively impact the performance of the CIS based semiconductor absorber layer from the stainless steel toward the sputtering layer.

11. The method of claim 7, wherein the support structure comprises a backing structure comprising the second material, and wherein the sputtering layer comprises a sputtering material.

12. The method of claim 7, wherein the first material comprises the transition metal selected from a group consisting of Mo, W, Ta, V, Ti, Nb, Zr and alloys thereof, and the alkali metal selected from a group consisting of Li, Na and K.

13. The method of claim 12, wherein:
    the first material comprises 0.5 to 10 wt % sodium, 0-50 wt % oxygen and balance molybdenum; and
    the alkali-containing transition metal layer of the first electrode comprises 0.5 to 10 wt % sodium, 0-50 wt % oxygen and balance molybdenum.

14. A method of forming a sputtering target, comprising:
forming a sputtering layer comprising a first material which comprises an alkali-containing transition metal directly on a second material of a support structure, wherein the support structure comprises a barrier layer comprising the second material formed on a backing structure of a third material that is different from the second material;
wherein the method further comprises:
providing a barrier foil;
attaching the barrier foil to the backing structure to form the barrier layer;
and
hot pressing the first material to the barrier layer to form the sputtering layer and to bond the barrier layer to the backing structure;
wherein:
the second material does not negatively impact a performance of a copper indium selenide (CIS) based semiconductor absorber layer of a solar cell;
the barrier layer is capable of blocking diffusion of atoms from the backing structure into the sputtering layer;
the backing structure comprises a planar support plate or a hollow support tube; and
the barrier layer is formed between the sputtering layer and the backing structure.

15. The method of claim 14, wherein the first material comprises the transition metal selected from a group consisting of Mo, W, Ta, V, Ti, Nb, Zr and alloys thereof, and the alkali metal selected from a group consisting of Li, Na and K.

16. The method of claim 15, wherein the first material comprises 0.5 to 10 wt % sodium, 0-50 wt % oxygen and balance molybdenum.

* * * * *